United States Patent [19]

Ogawa et al.

[11] Patent Number: 5,236,632
[45] Date of Patent: Aug. 17, 1993

[54] ZINC OXIDE SINTERED BODY, AND PREPARATION PROCESS AND USE THEREOF

[75] Inventors: Nobuhiro Ogawa; Takashi Mori, both of Shinnanyo, Japan

[73] Assignee: Tosoh Corporation, Japan

[21] Appl. No.: 844,193

[22] Filed: Mar. 2, 1992

Related U.S. Application Data

[62] Division of Ser. No. 563,153, Aug. 6, 1990.

[30] Foreign Application Priority Data

Aug. 10, 1989 [JP] Japan .................................. 1-205573
Aug. 24, 1990 [JP] Japan .................................. 2-106599

[51] Int. Cl.$^5$ .............................................. H01B 1/06
[52] U.S. Cl. .......................................... 252/518; 501/1
[58] Field of Search ................ 252/512, 518; 106/425; 501/1, 126; 264/65, 66

[56] References Cited

U.S. PATENT DOCUMENTS

| | | | |
|---|---|---|---|
| 3,538,023 | 11/1970 | Bowman | 252/518 |
| 4,142,996 | 3/1979 | Wong et al. | 252/518 |
| 4,767,729 | 8/1988 | Osman et al. | 501/94 |
| 4,948,529 | 8/1990 | Ritchie et al. | 252/501.1 |
| 5,026,672 | 6/1991 | Bayard | 501/134 |
| 5,102,650 | 4/1992 | Hayashi et al. | 423/622 |

*Primary Examiner*—Mark L. Bell
*Assistant Examiner*—Alan Wright
*Attorney, Agent, or Firm*—Finnegan, Henderson, Farabow, Garrett & Dunner

[57] ABSTRACT

An electroconductive zinc oxide sintered body composed of sintered particles fusion-bonded in the grain boundaries thereof; which has a sintered density of from 5 to 5.5 g/cm$^3$; and which does not substantially contain closed cells isolated from the outside in the interior of the sintered body. The electroconductive zinc oxide sintered body is prepared by sintering a mixture of an oxide of an element having a positive valency of at least 3 and zinc oxide in the presence of water at a temperature of at least 1,300° C. The electroconductive zinc oxide sintered body is used as a sputtering target for the preparation of a low resistance, transparent electroconductive film.

5 Claims, No Drawings

ZINC OXIDE SINTERED BODY, AND PREPARATION PROCESS AND USE THEREOF

This is a division of application Ser. No. 07/563,153, filed Aug. 6, 1990, pending.

BACKGROUND OF THE INVENTION (1) Field of the Invention

The present invention relates to an electroconductive metal oxide sintered body, a process for the preparation thereof, and the use thereof. More particularly, it relates to a zinc oxide sintered body which can be formed into a low-resistance, transparent, electroconductive film by the sputtering method, especially by the direct current magnetron sputtering method, a sputtering target, and a process for the preparation thereof.

(2) Description of the Related Art

There is now an increasing demand for a transparent electroconductive metal oxide film usable as a transparent electrode of a solar cell or display device or as an antistatic electroconductive coating.

A transparent electroconductive film of an electroconductive metal oxide is usually formed by sputtering a metal oxide, and as the metal oxide, there are industrially used indium oxide (ITO) which has been doped with tin as the hetero atom and tin oxide (TAO) which has been doped with antimony as the hetero atom.

ITO has a high transparency and a low-resistance film can be prepared from ITO, but ITO is economically disadvantageous because indium is expensive, and the field of application for ITO is restricted because ITO is chemically unstable. On the other hand, TAO is cheap and is relatively stable chemically, but since the resistance thereof is high, ATO is not completely satisfactory as the sputtering material.

It has been reported that a transparent electroconductive film having a low resistance comparable to that of ITO, and a high transparency, is obtained by sputtering zinc oxide which has been doped with aluminum or the like as the hetero atom [J. Appl. Phys., 55 (4), 15, February 1988, page 1029].

Since zinc oxide is cheap and chemically stable and has a good transparency and electroconductivity, zinc oxide is a satisfactory transparent electroconductive material that can be used instead of ITO and the like.

Nevertheless, the conventional hetero atom-containing zinc oxide sintered body used for the sputtering has a low density such as a sintered density lower than 5 $g/cm^3$ and a high resistance such as a resistivity higher than several k$\Omega$-cm. Since the density of this sintered body is low, the mechanical strength is low and the sintered body is very easily cracked. Moreover, since the electric resistance of this sintered body is high, the applicable sputtering method is limited, i.e., only the high-frequency sputtering method can be employed as the sputtering method, and the industrial direct current sputtering method cannot employed. Furthermore, in the case of the high-frequency sputtering method, if the substrate temperature is elevated, a problem arises of a lowering of the electroconductivity of the obtained zinc oxide transparent electroconductive film. Therefore, according to the conventional methods, a highly transparent electroconductive film cannot be obtained from the zinc oxide sintered body. If a sintered body having a high resistance and a low density is forcibly subjected to direct current sputtering, an applicable electric power is very small and the discharge is very unstable, and if a large electric power is forcibly applied, problems arise of a cracking of the target and a peeling and separation of the target from a backing plate.

The use of zinc oxide as a resistance element has been long known, and it has been pointed out that the electroconductivity of zinc oxide depends on the resistance of the grain boundary. Accordingly, it is known that, where zinc oxide is used as a resistance element, sintered particles are grown to a large grain size by elevating the sintering temperature and a sintered body having a relatively low resistance is obtained [The Journal of Association of Ceramics, 82, (5) page 271, 1974].

Nevertheless, the sintering property is reduced by the hetero atom incorporated to increase the electroconductivity, and an electroconductive zinc oxide sintered body having a high density such as a sintered density of at least 5 $g/cm^3$ has not been reported.

Moreover, in the case of zinc oxide in which a hetero atom has been incorporated, a problem arises in that growth of sintered particles and a melting and fusion bonding of grain boundaries of the sintered particles are advanced at the sintering step, and sealed pores, i.e., closed cells, insulated from the outside are left in the interior of the sintered body.

A fusion bonding of the grain boundaries of sintered particles causes a reduction of the electroconductivity of the sintered body, and a gas is generally contained in the pores left in the interior of the sintered body. Accordingly, when the sputtering is carried out by using this sintered body as the target, as the target is consumed, the pores are communicated with the outside and the gas contained in the pores is irregularly discharged to disturb the formation of the film. Especially, the zinc oxide transparent electroconductive film is sensitive to oxygen contained in the film-forming atmosphere, and the film is adversely influenced by the gas discharged from the interior of the zinc oxide sintered body.

In general, sputtering is carried out under a low pressure of from about 0.1 Pa to about 0.5 Pa, but if the gas is discharged from the above-mentioned pores, the inner pressure of the sputtering apparatus is elevated to a level higher than 1 Pa and control of the pressure becomes very difficult.

As apparent from the foregoing description, an electroconductive zinc oxide sintered body having a high density and a low resistance and able to be satisfactorily used as a direct current sputtering electrode for forming a zinc oxide transparent electroconductive film has not been proposed.

The inventors made investigations into electroconductive zinc oxide sputtering targets, and as a result, found that a zinc oxide sintered to be used as the sputtering target must have a high density and a low resistance and must not substantially contain in the interior thereof closed cells insulated from the outside. It also was found that this sintered body target can be obtained by sintering a mixture of an oxide having a positive valency of at least 3 and zinc oxide at a high temperature in the presence of water, to control the sintered density of zinc oxide and to effect a fusion-bonding grain of the boundaries of sintered particles. The inventors have completed the present invention based on these findings.

In one aspect of the present invention, there is provided an electroconductive zinc oxide sintered body which is composed of sintered particles fusion-bonded substantially only in the grain boundaries thereof;

which has a sintered density of from 5 to 5.5 g/cm³; and which does not substantially contain closed cells insulated from the outside in the interior of the sintered body.

In another aspect of the present invention, there is provided a process for the preparation of an electroconductive zinc oxide sintered body, which comprises sintering a mixture of an oxide of an element having a positive valency of at least 3 and zinc oxide in the presence of water at a temperature of at least 1,300° C.

In a further aspect of the present invention, there is provided a sputtering target composed of the above-mentioned electroconductive zinc oxide sintered body.

DESCRIPTION OF THE PREFERRED EMBODIMENTS

The zinc oxide sintered body of the present invention is a sintered body of zinc oxide containing an oxide of an element having a positive valency of at least 3. As the element having a positive valency of at least 3, there can be mentioned Sc and Y of group IIIB of the Periodic Table, B, Al, Ga, In and Tl of the group IIIA, Ti, Zr, Hf and Th of the group IVB, C, Si, Ge, Sn and Pb of the group IVA, V, Nb, Ta and Pa of the group VB, As Sb and Bi of the group VA, Cr, Mo, W and U of the group VIB, Se, Te and Po of the group VIA, Mn, Tc and Re of the group VIIB, Fe, Co, Ni, Ru, Rh, Pd, Os, Ir and Pt of the group VIII, Lanthanide elements, and antinide elements. The content of this element is preferably 0.1 to 20 atomic %, more preferably 0.5 to 5 atomic %, based on zinc, and if the content of this element is within this range, a zinc oxide sintered body having a very low resistance can be obtained.

The sintered body of the present invention can be obtained by preferably preliminarily molding a mixture having the above-mentioned composition and sintering the molded mixture at a high temperature.

In the present invention, the sintering temperature is at least 1,300° C., and preferably, to melt grain boundaries of sintered particles, a temperature of at least 1,400° C. is adopted for the sintering. If the sintering temperature is too high, however, the melting of zinc oxide is advanced not only in grain boundaries of sintered particles but also in the entire particles, and it becomes difficult to obtain the sintered body of the present invention. Accordingly, the sintering is preferably carried out at a temperature not higher than 1,500° C., more preferably at a temperature not higher than 1,450° C. The sintering time is preferably in the range of from about 5 to about 20 hours.

In the preparation process of the present invention, the presence of water in the atmosphere is indispensable, but other conditions are not particularly critical. Sintering can be carried out either in the air or in an inert gas atmosphere. From the industrial viewpoint, sintering is preferably carried out in the air. As the means for supplying water into the sintering atmosphere, a method can be adopted in which the atmosphere is prepared by suing steam or the like, but the use of the starting oxide in the form of a hydrate is especially effective. For example, an oxide of the hetero atom as the dopant can be used in the form of a hydrate.

Where water is supplied to the sintering atmosphere, a supply of water-bubbled air into a sintering furnace will suffice. In the process of the present invention, it is sufficient if the amount of water is from scores of ppm to thousands of ppm, especially from about 100 ppm to about 5,000 ppm. The presence of an excessive amount of water is not preferred because the sintered density is not elevated to a desired level.

The zinc oxide sintered body of the present invention has a sintered density of from 5 to 5.5 g/cm³, especially from 5 to 5.3 g/cm³. If the sintered density of the sintered body is higher than 5.5 g/cm³, when the grain boundaries of sintered particles are fused at the sintering step, it is difficult to obtain a sintered body having closed cells not substantially left in the interior thereof.

In the sintered body of the present invention, no reduction of the electroconductivity by the grain boundaries of sintered particles occurs, and therefore, the sintered body of the present invention has a good electroconductivity and a low resistance of from 10 to $1 \times 10^{-3}$ Ω-cm. Accordingly, the sintered body of the present invention can be satisfactorily used as a target for the direct current sputtering.

The sintered body of the present invention where the grain boundaries of particles are fusion-bonded can be distinguished from sintered bodies where this fusion is not caused, based on the difference of the electroconductivity.

In the present invention, water must be made present in the sintering atmosphere, as is considered that, by carrying out the sintering under this condition, the improvement of the sintered density of the sintered body before the fusion of sintered particles is appropriately controlled. If the sintering is carried out in a water-free dry atmosphere, the sintered density of zinc oxide is excessively improved, and therefore, if fusion bonding of the grain boundaries of sintered bodies is caused to occur with a view to improving the electroconductivity, closed cells insulated from the outside are left in the interior of the sintered body and the formed sintered body is not suitable as a sputtering target. The presence of water in a sintering atmosphere results in attainment of an effect of appropriately controlling the sintering of zinc oxide, and therefore, the elevation of the sintered density is controlled, and even if fusion bonding of grain boundaries of sintered particles is effected, a formation of closed cells left in the interior of the sintered body is controlled, with the result that an electroconductive zinc oxide sputtering target having a high density and a low resistance, in which closed cells insulated from the outside are not substantially left in the interior of the sintered body, can be obtained.

The sputtering target of the present invention is characterized in that closed cells insulated from the outside are not substantially present. The presence or absence of such closed cells can be confirmed by measuring the sintered density of the sintered body constituting the target. As the means for measuring the sintered density of the sintered body, there can be mentioned a method in which the apparent density is determined by dividing the weight of the sintered body by the apparent volume of the sintered body, and a method in which the true density of the sintered body is determined by measuring the true volume from the difference between the weight of the sintered body in air and the weight of the sintered body in water according to the Archimedean principle. If closed cells are present in the interior of the sintered body, since water is not allowed to intrude into the closed cells, the values of the sintered density of the sintered body determined according to the above-mentioned two methods are substantially equal. On the other hand, if cells present in the interior of the sintered body are not closed, the value of the volume of the sintered body determined according to the Archimedean method is smaller, and therefore, the sintered density obtained from this value is larger than the apparent density.

From the results obtained according to the above-mentioned measurement methods, it is possible to confirm whether or not closed cells insulated from the outside are substantially left in the interior of the target.

The zinc oxide sintered body of the present invention has very good performances as a sputtering target for forming a transparent electroconductive film.

Since the sintered body of the present invention has a low resistance, the direct current sputtering method can be employed, and if the sintered body of the present invention is used for the direct current sputtering method, the sputtering can be effected at a stable discharge state and since the sintered body has a high density, a high film-forming speed can be attained. Furthermore, since the sintered body has a high mechanical strength, problems such as cracking and separation of the target do not occur.

It is important to note that, since closed cells are not substantially present in the interior of the sintered body, degasification does not occur in the target during the sputtering operation, and even when the sputtering is carried out for a long time on an industrial scale, the gas pressure and film quality can be very easily controlled.

The present invention will not be described in detail with reference to the following examples that by no means limit the scope of the invention.

EXAMPLE 1

Zinc oxide was mixed with aluminum oxide ($\gamma$-alumina) containing water of crystallization at a mixing weight ratio of 98/2, and the mixture was molded and sintered in air at 1,400° C. for 5 hours. The obtained sintered body had a sintered density of 5.4 g/cm$^3$ and a resistivity of 2 m$\Omega$-cm. From the results of the measurement of the density, it was confirmed that closed cells were not present.

By using this sintered body as a sputtering target, DC magnetron sputtering was carried out in a pure argon atmosphere under a sputtering pressure of 0.6 Pa at an substrate temperature of 150° C., with an applied power of 4 W/cm$^2$, to form a film. During the sputtering operation, variations of the pressure by degasification or abnormal discharge did not occur. The obtained film was a transparent electroconductive film having a resistivity of 0.3 m$\Omega$-cm at a film thickness of 3,000 Å and a luminous transmittance higher than 85% at 550 nm.

EXAMPLE 2

Zinc oxide was mixed with aluminum oxide ($\alpha$-alumina) free of water of crystallization at a mixing weight ratio of 98/2, and the mixture was molded and sintered at 1,400° C. for 5 hours in a sintering furnace in which air bubbled with water maintained at room temperature (20° C.) was introduced.

The obtained sintered body had a sintered density of 5.4 g/cm$^3$ and a resistivity of 5 m$\Omega$-cm. From the results of the measurement of the density, it was confirmed that closed cells were not present in the interior of the sintered body.

By using this sintered body as a sputtering target, a DC magnetron sputtering was carried out in a pure argon atmosphere under a sputtering pressure of 0.6 Pa at a substrate temperature of 150° C., with an applied power of 4 W/cm$^2$, to form a film. During the sputtering operation, variation of the pressure by degasification and abnormal discharge did not occur. The obtained film was a transparent electroconductive film having a resistivity of 0.3 m$\Omega$-cm at a film thickness of 3,000 Å and a luminous transmittance higher than 85% at 550 nm.

COMPARATIVE EXAMPLE 1

The powdery mixture prepared in Example 2 was sintered in dry air at 1,400° C. for 5 hours to obtain a deep-green sintered body having a sintered density of 5.5 g/cm$^3$ and a resistivity of 3 m$\Omega$-cm.

By using this sintered body as a sputtering target, DC magnetron sputtering was carried out in a pure argon atmosphere under a sputtering pressure of 0.6 Pa at a substrate temperature of 150° C., with an applied power of 4 W/cm$^2$, to form a film. Variations of the pressure by degasification and abnormal discharge occurred during the sputtering operation. In the obtained transparent electroconductive film, the resistivity at a film thickness of 3,000 Å varied in the range of from 0.6 to 1.5 m$\Omega$-cm, and the luminous transmittance at 550 nm varied in the range of from 75 to 85%.

We claim:

1. A process for the preparation of an electroconductive zinc oxide sintered body, which comprises the steps of:

mixing powdery zinc oxide and a powdery hydrate of at least one oxide of an element having a positive valency of at least 3, and sintering the mixture at a temperature of at least 1,300° C.;

said element being selected from the group consisting of Sc and Y of groups IIIB of the Periodic Table, B, Al, Ga, In and Tl of the group IIIA, Ti, Zr, Hf and Th of the group IVB, C, Si, Ge, Sn and Pb of the group IVA, V, Nb, Ta and Pa of the group VB, As, Sb and Bi of the group VA, Cr, Mo, W and U of the group VIB, Se, Te and Po of the group VIA, Mn, Tc and Re of the group VIIB, Fe, Co, Ni, Ru, Rh, Pd, OS, Ir and Pt of the group VIII, lanthanide elements, and actinide elements, and the amount of said element being from 0.1 to 20 atomic % based on the amount of the zinc of the zinc oxide.

2. The process according to claim 1, wherein the amount of the element having a positive valency of at least 3 is from 0.5 to 5 atomic % based on the amount of the zinc of the zinc oxide.

3. The process according to claim 1, wherein the mixture of the oxide of the element having a positive valency of at least 3 and the zinc oxide is first molded, and the resulting molded mixture is then subjected to sintering.

4. The process according to claim 1, wherein the sintering is carried out at a temperature of from 1,400° C. to 1,500° C. for from 5 to 20 hours.

5. The process according to claim 1, wherein the sintering is carried out at a temperature of from 1,450° C. to 1,500° C.

* * * * *